(12) United States Patent
Ohashi et al.

(10) Patent No.: US 11,027,970 B2
(45) Date of Patent: Jun. 8, 2021

(54) METHOD OF MANUFACTURING SEMICONDUCTOR DEVICE

(71) Applicant: Kokusai Electric Corporation, Tokyo (JP)

(72) Inventors: Naofumi Ohashi, Toyama (JP); Yoshiro Hirose, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 6 days.

(21) Appl. No.: 16/560,577

(22) Filed: Sep. 4, 2019

(65) Prior Publication Data

US 2020/0095120 A1 Mar. 26, 2020

(30) Foreign Application Priority Data

Sep. 26, 2018 (JP) .............................. JP2018-180009

(51) Int. Cl.
*B81C 1/00* (2006.01)
*H01H 1/00* (2006.01)

(52) U.S. Cl.
CPC ....... *B81C 1/00595* (2013.01); *H01H 1/0036* (2013.01); *B81C 2201/0109* (2013.01); (Continued)

(58) Field of Classification Search
CPC ........ B81C 1/00595; B81C 2201/0133; B81C 2201/0109; B81C 1/00476; B81C 1/0015;
(Continued)

(56) References Cited

U.S. PATENT DOCUMENTS 6,054,206 A 4/2000 Mountsier
6,413,879 B1 7/2002 Maeda
(Continued)

FOREIGN PATENT DOCUMENTS

JP 2000-269207 A 9/2000
JP 2006-175583 A 7/2006
(Continued)

OTHER PUBLICATIONS

Office Action in corresponding Korean Patent Application No. 10-2019-0108271, dated Sep. 22, 2020, with English translation.
(Continued)

*Primary Examiner* — Julia Slutsker
(74) *Attorney, Agent, or Firm* — Edell, Shapiro & Finnan, LLC

(57) ABSTRACT

Described herein is a technique capable of forming a sacrificial film with a high wet etching rate so as to obtain a wet etching selectivity with respect to a movable electrode when manufacturing a cantilever structure sensor. According to one aspect of the technique of the present disclosure, there is provided a method of manufacturing a semiconductor device including: (a) placing a substrate with a sacrificial film containing impurities on a substrate support in a process chamber, wherein the sacrificial film is formed so as to cover a control electrode, a pedestal and a counter electrode formed on the substrate; (b) heating the substrate; and (c) modifying the sacrificial film into a modified sacrificial film by supplying an oxygen-containing gas in a plasma state to the substrate to desorb the impurities from the sacrificial film after (b).

20 Claims, 5 Drawing Sheets

(52) U.S. Cl.
CPC ............... *B81C 2201/0133* (2013.01); *H01H 2001/0084* (2013.01)

(58) Field of Classification Search
CPC ......... H01H 1/0036; H01H 2001/0084; H01H 2050/007; H01H 50/005; H01H 2001/0052; H01H 2001/0078; B81B 2201/014; B81B 2203/0118; H01L 21/67103; H01L 21/3105
See application file for complete search history.

(56) References Cited

U.S. PATENT DOCUMENTS

| | | | | |
|---|---|---|---|---|
| 2002/0171518 | A1* | 11/2002 | Hsu | H01G 5/18 335/78 |
| 2007/0018761 | A1 | 1/2007 | Yamanaka et al. | |
| 2013/0273326 | A1 | 10/2013 | Denifl et al. | |
| 2014/0159065 | A1 | 6/2014 | Hu et al. | |
| 2014/0342573 | A1* | 11/2014 | Hirose | C23C 16/455 438/761 |
| 2015/0368803 | A1 | 12/2015 | Yim et al. | |

FOREIGN PATENT DOCUMENTS

| | | |
|---|---|---|
| JP | 2007-035290 A | 2/2007 |
| JP | 2010-164394 A | 7/2010 |
| JP | 2012-86315 A | 5/2012 |
| JP | 2013-239899 A | 11/2013 |

OTHER PUBLICATIONS

Office Action in corresponding Japanese Patent Application No. 2018-180009, dated Sep. 25, 2020, with English translation.

* cited by examiner

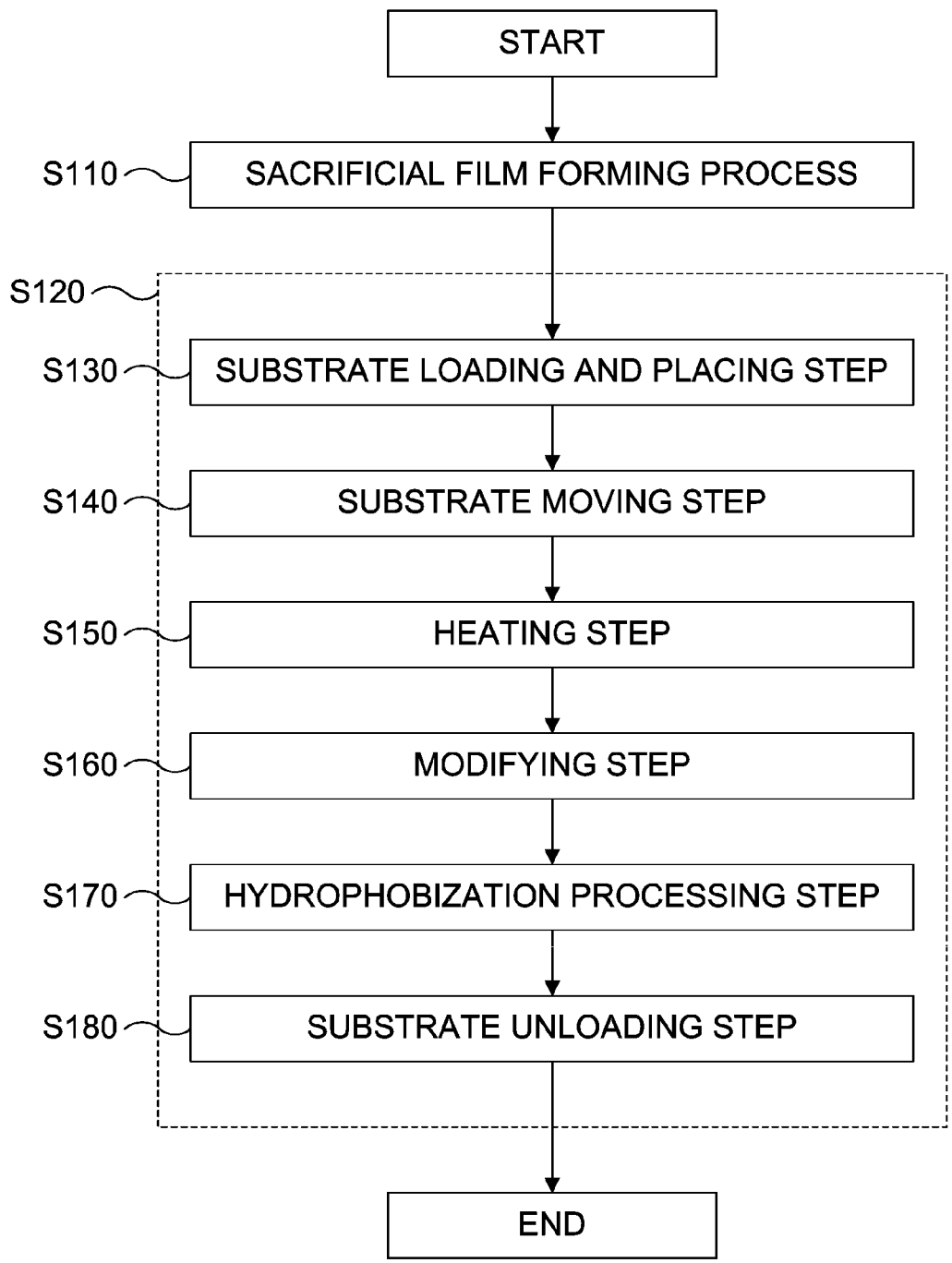

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2018-180009 filed on Sep. 26, 2018, the entire contents of which are hereby incorporated by reference.

TECHNICAL FIELD

The present disclosure relates to a method of manufacturing a semiconductor device.

BACKGROUND

Recently, a sensor using MEMS (Micro-Electro-Mechanical Systems) technology has been produced as one of semiconductor devices. For example, a cantilever structure is used to form the sensor. According to related arts, a method of manufacturing a switch employing the cantilever structure is disclosed. According to the related arts, the method of manufacturing the switch including forming a movable electrode by a dry etching process and then etching a sacrificial film formed below the movable electrode by a wet etching process is disclosed.

As described above, the movable electrode of the cantilever structure is formed by the dry etching process. However, as a result of intensive research, the inventors of the present application discovered that constituent materials of the movable electrode may deteriorate due to the dry etching process.

When a wet etching rate of the movable electrode is decreased by the deterioration of the movable electrode, the wet etching rate of the movable electrode may approach a wet etching rate of the sacrificial film. Therefore, the movable electrode may also be etched when the sacrificial film is etched by the wet etching process.

SUMMARY

Described herein is a technique capable of forming a sacrificial film with a high wet etching rate so as to obtain a wet etching selectivity with respect to a movable electrode when manufacturing a cantilever structure sensor.

According to one aspect of the technique of the present disclosure, there is provided a method of manufacturing a semiconductor device including: (a) placing a substrate with a sacrificial film containing impurities on a substrate support in a process chamber, wherein the sacrificial film is formed so as to cover a control electrode, a pedestal and a counter electrode formed on the substrate; (b) heating the substrate; and (c) modifying the sacrificial film into a modified sacrificial film by supplying an oxygen-containing gas in a plasma state to the substrate to desorb the impurities from the sacrificial film after (b).

BRIEF DESCRIPTION OF THE DRAWINGS

FIG. 8 is a flow chart schematically illustrating a substrate processing according to the embodiments described herein.

DETAILED DESCRIPTION

Embodiments

Hereinafter, one or more embodiments (hereinafter, simply referred to as "embodiments") according to the technique of the present disclosure will be described with reference to the drawings.

Figure 1A:
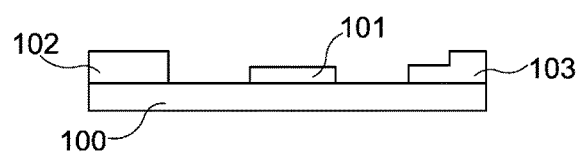
FIGS. 1A through 1F schematically illustrate a processing state of a substrate, respectively, according to one or more embodiments described herein.

A configuration of a substrate to be processed according to the embodiments will be described with reference to FIGS. 1A through 2D. That is, a method of manufacturing an MEMS switch employing a cantilever structure will be described with reference to FIGS. 1A through 2D. The substrate in a processing state shown in FIG. 1A is processed in order from a processing state shown in FIG. 1B to a processing stated shown in FIG. 1F. Then, the substrate in the processing state shown in FIG. 1F is processed in order from a processing state shown in FIG. 2A to a processing state shown in FIG. 2D.

A substrate 100 shown in FIG. 1A will be described. Referring to FIG. 1A, a control electrode 101, a pedestal (which may be a base or a support) 102 and a counter electrode 103 are formed on the substrate 100. The control electrode 101 is configured to control a movable electrode 111 described later, the pedestal 102 is configured to support the movable electrode 111, and the counter electrode 103 is an electrode paired with the movable electrode 111. Details thereof will be described later.

Figure 1B:
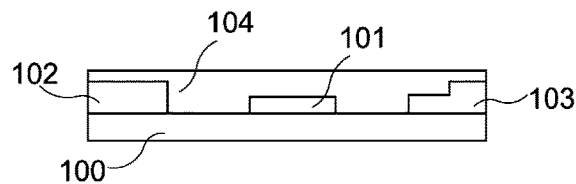

FIG. 1B schematically illustrates a processing state of the substrate 100 when a sacrificial film 104 is formed on the substrate 100 on which the control electrode 101, the pedestal 102 and the counter electrode 103 are formed. The sacrificial film 104 is removed later so as to enable the operation of the movable electrode 111. The method of forming the sacrificial film 104 will be described later.

Figure 1C:
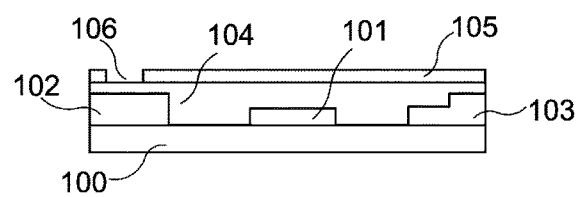

FIG. 1C schematically illustrates a processing state of the substrate 100 when a photoresist 105 is formed on the sacrificial film 104 and a pattern is further formed.

Figure 1D:
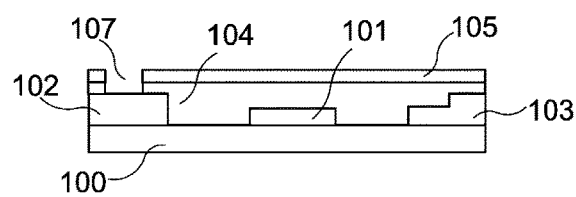

FIG. 1D schematically illustrates a processing state of the substrate 100 when the sacrificial film 104 is etched by a dry etching process in accordance with a shape of the pattern 106. Thereby, a hole 107 is formed such that a surface of the pedestal 102 is exposed. For example, a known plasma etching process is performed as the dry etching process.

Figure 1E:
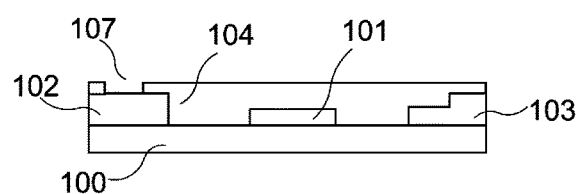
Figure 1F:
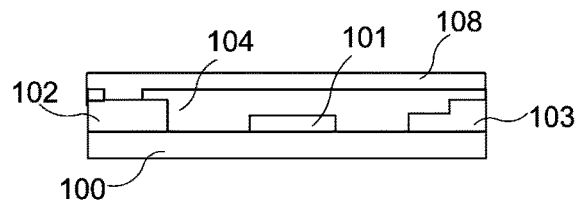

FIG. 1E schematically illustrates a processing state of the substrate 100 when the photoresist 105 is removed. For example, the photoresist 105 is removed by a known plasma ashing process.

FIG. 1F schematically illustrates a processing state of the substrate 100 when a polysilicon film 108 is formed on the pedestal 102 and the sacrificial film 104. The polysilicon film 108 is processed later to form the movable electrode 111. The polysilicon film 108 is electrically connected to the pedestal 102.

Figure 2A:
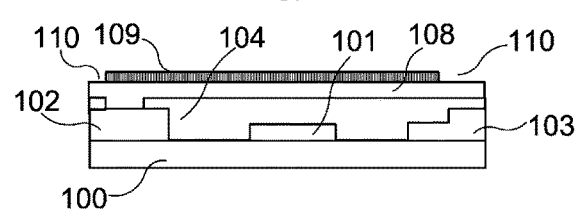
FIGS. 2A through 2D schematically illustrate a processing state of the substrate, respectively, according to the embodiments described herein.

Subsequently, processing states of the substrate 100 will be described with reference to FIGS. 2A through 2D. FIG. 2A schematically illustrates a processing state of the substrate 100 when a photoresist 109 is formed on the polysilicon film 108 and a pattern 110 is further formed after the processing state shown in FIG. 1F.

Figure 2B:
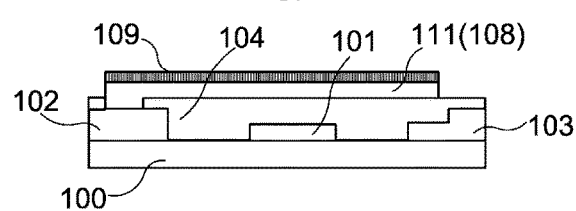

FIG. 2B schematically illustrates a processing state of the substrate 100 when the polysilicon film 108 is etched by a dry etching process in accordance with a shape of the pattern 110. Thereby, the polysilicon film 108 is processed into a shape of the movable electrode 111. For example, a known plasma etching process is performed as the dry etching process.

Figure 2C:
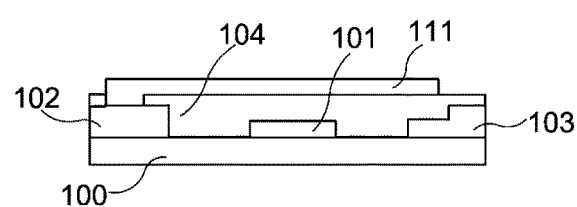

FIG. 2C schematically illustrates a processing state of the substrate 100 when the photoresist 109 is removed. For example, the photoresist 109 is removed by a known plasma ashing process.

Figure 2D:
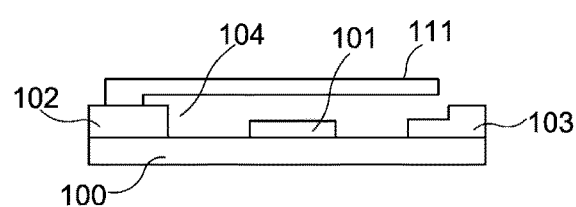

FIG. 2D schematically illustrates a processing state of the substrate 100 when the sacrificial film 104 is removed by a wet etching process. Thereby, the movable electrode 111, the control electrode 101 and the counter electrode 103 are separated from each other.

Hereinafter will be described problems of the above-mentioned method of manufacturing the MEMS switch discovered by the inventors of the present application. In the method described above, for example, the polysilicon film 108 is etched by the plasma etching process as shown in FIGS. 2A and 2B, or the photoresist 109 is removed by the plasma ashing process as shown in FIGS. 2B and 2C. During the plasma etching process or the plasma ashing process, the polysilicon film 108 is exposed to plasma to be damaged and deteriorated, and as a result, the strength thereof is decreased.

A wet etching rate of the deteriorated polysilicon film 108 is increased. Therefore, wet etching rates of the sacrificial film 104 and the movable electrode 111 approach each other. Then, when the sacrificial film 104 is etched by the wet etching process, the deteriorated portion of the polysilicon film 108 is also etched. When electric power is supplied to the movable electrode 111 in a state where the deteriorated portion of the polysilicon film 108 is also etched, the electric power may be concentrated on the deteriorated portion of the polysilicon film 108 or the electric power may not propagate easily.

In order to address the problems described above, it is required to obtain a wet etching selectivity such that the wet etching rate of the sacrificial film 104 is different from that of the movable electrode 111. Therefore, according to the embodiments, the sacrificial film 104 with a wet etching rate higher than that of the processed polysilicon film 108 is formed.

Hereinafter, an example of a substrate processing apparatus 200 of forming the sacrificial film 104 will be described with reference to FIG. 3.

Chamber

First, a chamber 202 will be described. The substrate processing apparatus 200 includes the chamber 202. For example, the chamber 202 is configured as a flat and sealed vessel with a circular horizontal cross-section. For example, the chamber 202 is made of a metal material such as aluminum (Al) and stainless steel (SUS). A process space 205 where the substrate 100 such as a silicon substrate is processed and a transfer space 206 through which the substrate 100 is transferred into the process space 205 are provided in the chamber 202. The chamber 202 includes an upper vessel 202a and a lower vessel 202b. A partition plate 208 is provided between the upper vessel 202a and the lower vessel 202b. The substrate 100 to be processed by the substrate processing apparatus 200 is in the processing state as shown in FIG. 1A. Therefore, the control electrode 101, the pedestal 102 and the counter electrode 103 are formed on the substrate 100.

A substrate loading/unloading port 148 is provided on a side surface of the lower vessel 202b adjacent to a gate valve 149. The substrate 100 is transferred between a vacuum transfer chamber (not shown) and the transfer space 206 through the substrate loading/unloading port 148. Lift pins 207 are provided at a bottom of the lower vessel 202b. The lower vessel 202b is electrically grounded.

A process chamber constituting the process space 205 is constituted by, for example, a shower head 230 and a substrate support table 212 which will be described later. A substrate support 210 capable of supporting the substrate 100 is provided in the process space 205. The substrate support 210 mainly includes the substrate support table 212 having a substrate placing surface 211 on which the substrate 100 is placed and a heater 213 serving as a heating source embedded in the substrate support table 212. Through-holes 214 penetrated by the lift pins 207 are provided at the substrate support table 212 corresponding to the locations of the lift pins 207. A temperature controller 220 capable of controlling a temperature of the heater 213 is connected to the heater 213.

The substrate support table 212 is supported by a shaft 217. A support portion of the shaft 217 penetrates a hole provided at a bottom of the chamber 202. The shaft 217 is connected to an elevating mechanism 218 outside the chamber 202 via a support plate 216. The substrate 100 placed on the substrate placing surface 211 is elevated and lowered by operating the elevating mechanism 218 by elevating and lowering the shaft 217 and the substrate support table 212. A bellows 219 covers a periphery of a lower end of the shaft 217. As a result, the interior of the chamber 202 is maintained airtight.

When the substrate 100 is transferred, the substrate support table 212 is moved downward until the substrate placing surface 211 faces the substrate loading/unloading port 148 (that is, the substrate support table 212 is moved to a substrate transfer position). When the substrate 100 is processed, the substrate support table 212 is moved upward until the substrate 100 reaches a substrate processing position in the process space 205 as shown in FIG. 3.

Specifically, when the substrate support table 212 is lowered to the substrate transfer position, upper end portions of the lift pins 207 protrude from an upper surface of the substrate placing surface 211, and the lift pins 207 support the substrate 100 from thereunder. When the substrate support table 212 is elevated to the substrate processing position, the lift pins 207 are buried from the upper surface of the substrate placing surface 211 and the substrate placing surface 211 supports the substrate 100 from thereunder.

The shower head 230 is provided above (upstream side of) the process chamber. The shower head 230 includes a cover 231. The cover 231 includes a flange 232. The flange 232 is supported by the upper vessel 202a. The cover 231 also includes a position guiding protrusion 233. The cover 231 is fixed by the position guiding protrusion 233 being engaged with the upper vessel 202a.

The shower head 230 includes a buffer space 234. The buffer space 234 refers to a space defined by the cover 231 and the position guiding protrusion 233. The buffer space 234 is spatially in communication with the process space 205. A gas supplied into the buffer space 234 is diffused in the buffer space 234 and uniformly supplied to the process space 205. According to the embodiments, the buffer space 234 and the process space 205 are separate spaces. However, the embodiments are not limited thereto. For example, the buffer space 234 may be included in the process space 205.

The process space 205 is defined by the upper vessel 202a and an upper structure of the substrate support table 212 at the substrate processing position. Structures defining the process space 205 may also be referred to as the process chamber. The structures defining the process space 205 are not limited to the above configuration as long as the process space 205 can be defined thereby.

The transfer space 206 is defined by the lower vessel 202b and a lower structure of the substrate support table 212 at the substrate processing position. Structures defining the transfer space 206 may also be referred to as a "transfer chamber", and the transfer chamber is provided under the process chamber. The structures defining the transfer space 206 are not limited to the above configuration as long as the transfer space 206 can be defined thereby.

Gas Supply System

Next, a gas supply system will be described. A first gas supply pipe 243a, a second gas supply pipe 247a and a third gas supply pipe 249a are connected to a common gas supply pipe 242.

A first process gas is supplied mainly though a first gas supply system 243 including the first gas supply pipe 243a. A second process gas is supplied mainly though a second gas supply system 247 including the second gas supply pipe 247a. An inert gas is supplied though a third gas supply system 249 including the third gas supply pipe 249a.

First Gas Supply System

A first gas supply source 243b, a mass flow controller (MFC) 243c serving as a flow rate controller (flow rate control mechanism) and a valve 243d serving as an opening/closing valve are provided at the first gas supply pipe 243a in order from an upstream side to a downstream side of the first gas supply pipe 243a. A remote plasma mechanism (also referred to as a "remote plasma unit" or "RPU") 243e serving as a plasma generator may be provided at a downstream side of the valve 243d of the first gas supply pipe 243a to activate the first process gas into a plasma state.

A gas containing a first element (hereinafter, also referred to as the "first process gas" or a "first element-containing gas") is supplied into the shower head 230 via the first gas supply pipe 243a provided with the MFC 243c and the valve 243d and the common gas supply pipe 242. The first process gas is activated into the plasma state by the RPU 243e and then is supplied into the shower head 230.

The first process gas is one of process gases. For example, the first process gas may include an oxygen-containing gas. For example, oxygen ($O_2$) gas may be used as the oxygen-containing gas.

The first gas supply system 243 is constituted mainly by the first gas supply pipe 243a, the MFC 243c, the valve 243d and the RPU 243e. The first gas supply system may further include the first gas supply source 243b and a hydrogen-containing gas supply system which will be described later.

A downstream end of a hydrogen-containing gas supply pipe 245a is connected to the first gas supply pipe 243a at a downstream side of the valve 243d provided at the first gas supply pipe 243a. A hydrogen-containing gas supply source 245b, a mass flow controller (MFC) 245c serving as a flow rate controller (flow rate control mechanism) and a valve 245d serving as an opening/closing valve are provided at the hydrogen-containing gas supply pipe 245a in order from an upstream side to a downstream side of the hydrogen-containing gas supply pipe 245a. A hydrogen-containing gas is supplied into the shower head 230 via the hydrogen-containing gas supply pipe 245a provided with the MFC 245c and the valve 245d, the first gas supply pipe 243a and the RPU 243e. As described later, the sacrificial film 104 is hydrogen-terminated by supplying the hydrogen-containing gas. That is, hydrogen-terminated sites are provided on the surface of the sacrificial film 104.

For example, a gas such as hydrogen ($H_2$) gas and water vapor ($H_2O$) gas may be used as the hydrogen-containing gas.

The hydrogen-containing gas supply system is constituted mainly by the hydrogen-containing gas supply pipe 245a, the MFC 245c and the valve 245d. The hydrogen-containing gas supply system may further include the hydrogen-containing gas supply source 245b, the first gas supply pipe 243a and the RPU 243e. The hydrogen-containing gas supply system may be included in the first gas supply system 243.

Second Gas Supply System

A second gas supply source 247b, a mass flow controller (MFC) 247c serving as a flow rate controller (flow rate control mechanism) and a valve 247d serving as an opening/closing valve are provided at the second gas supply pipe 247a in order from an upstream side to a downstream side of the second gas supply pipe 247a.

A gas containing a second element (hereinafter, also referred to as the "second process gas") is supplied into the shower head 230 via the second gas supply pipe 247a provided with the mass flow controller 247c and the valve 247d and the common gas supply pipe 242.

The second process gas is a gas containing silicon (Si). That is, the second process gas may include a silicon-containing gas. The second process gas is one of the process gases. For example, disilane ($Si_2H_6$) gas may be used as the silicon-containing gas.

The second gas supply system (also referred to as a "silicon-containing gas supply system") 247 is constituted mainly by the second gas supply pipe 247a, the mass flow controller 247c and the valve 247d.

Third Gas Supply System

A third gas supply source 249b, a mass flow controller (MFC) 249c serving as a flow rate controller (flow rate control mechanism) and a valve 249d serving as an opening/closing valve are provided at the third gas supply pipe 249a in order from an upstream side to a downstream side of the third gas supply pipe 249a.

The third gas supply source 249b is an inert gas supply source. For example, the inert gas may include nitrogen ($N_2$) gas.

The third gas supply system 249 is constituted mainly by the third gas supply pipe 249a, the mass flow controller 249c and the valve 249d.

The inert gas supplied from the third gas supply source (also referred to as an "inert gas supply source") 249b acts as a purge gas of purging a residual gas in the chamber 202 or in the shower head 230 during a substrate processing described later. The inert gas may also be supplied from the third gas supply source 249b in a heating step which will be described later.

Exhaust System

An exhaust system of exhausting an inner atmosphere of the chamber 202 is constituted mainly by a process space exhaust system 261 of exhausting an inner atmosphere of the process space 205.

The process space exhaust system 261 includes an exhaust pipe 261a connected to the process space 205. The exhaust pipe 261a is spatially in communication with the process space 205. An APC (Automatic Pressure Controller) 261c of adjusting an inner pressure of the process space 205 to a predetermined pressure and a pressure detector 261d of detecting the inner pressure of the process space 205 are provided at the exhaust pipe 261a. The APC 261c includes an adjustable valve body (not shown). The APC 261c is configured to adjust the conductance of the exhaust pipe 261a in response to an instruction from a controller 280 which will be described later. A valve 261b is provided at an upstream side of the APC 261c provided at the exhaust pipe 261a. The exhaust pipe 261a, the valve 261b, the APC 261c and the pressure detector 261d are collectively referred to as the process space exhaust system 261.

A dry pump (DP) 278 is provided at a downstream side of the exhaust pipe 261a. The DP 278 exhausts the inner atmosphere of the process space 205 via the exhaust pipe 261a.

Controller

Figure 4:
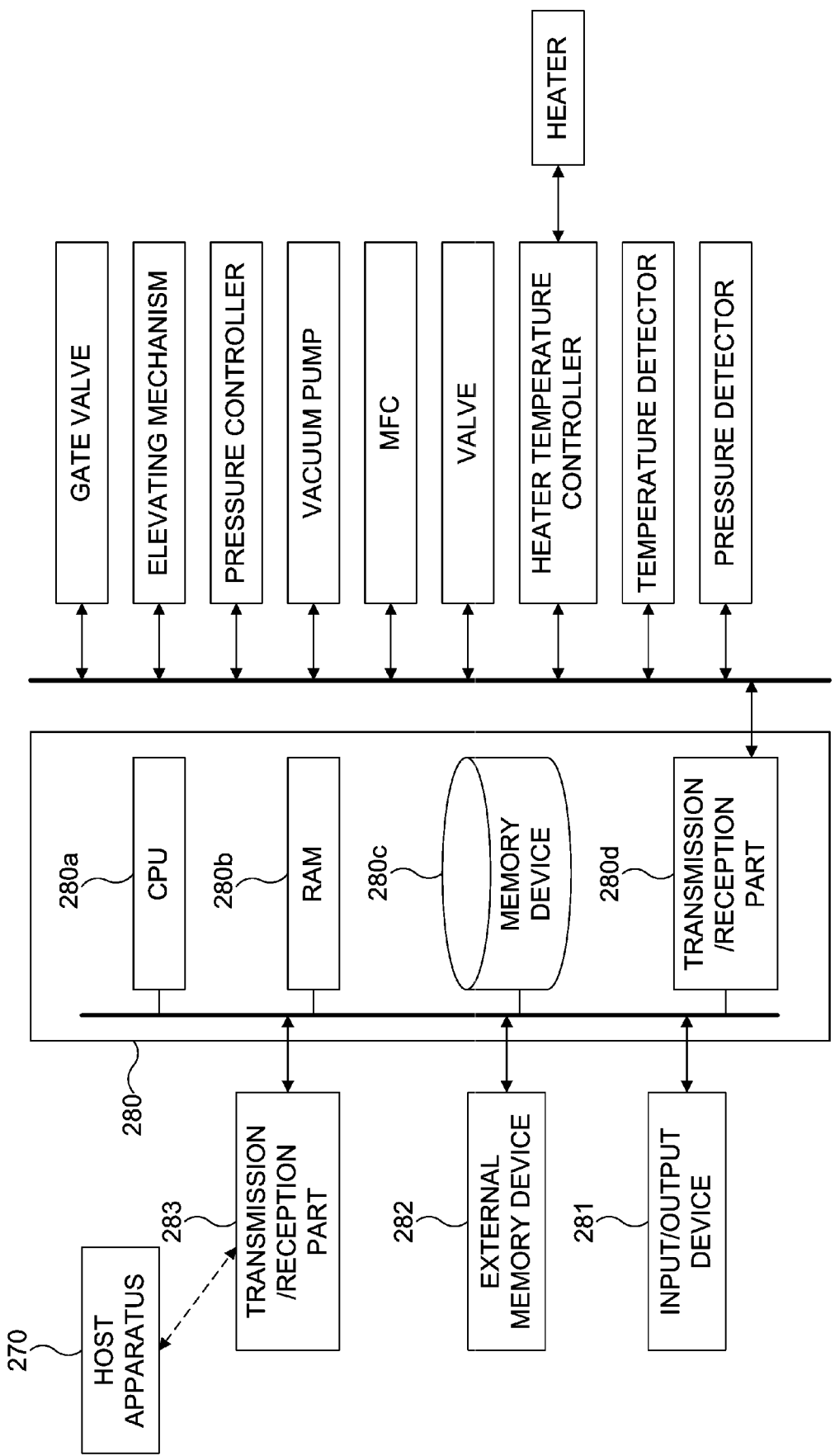
FIG. 4 is a block diagram schematically illustrating a configuration of a controller and related components of the substrate processing apparatus according to the embodiments described herein.

The substrate processing apparatus 200 includes the controller 280 configured to control the operations of components of the substrate processing apparatus 200. As shown in FIG. 4, the controller 280 includes at least a CPU (Central Processing Unit) 280a serving as an arithmetic unit, a RAM (Random Access Memory) 280b serving as a temporary memory device, a memory device 280c and a transmission/reception part 280d. The controller 280 is connected to the components of the substrate processing apparatus 200 via the transmission/reception part 280d, calls a program or a recipe from the memory device 280c in accordance with an instruction of a host controller or a user, and controls the operations of the components of the substrate processing apparatus 200 according to the contents of the instruction. The controller 280 may be embodied by a dedicated computer or as a general-purpose computer. According to the embodiments, the controller 280 may be embodied by preparing an external memory device 282 and installing the program onto the general-purpose computer using the external memory device 282. For example, the external memory device 282 may include a magnetic tape, a magnetic disk such as a flexible disk and a hard disk, an optical disk such as a CD and a DVD, a magneto-optical disk such as MO and a semiconductor memory such as a USB memory (USB flash drive) and a memory card. The means for providing the program to the computer is not limited to the external memory device 282. The program may be supplied to the computer using communication means such as the Internet and a dedicated line. The program may be provided to the computer without using the external memory device 282 by receiving the information (that is, the program) from a host apparatus 270 via a transmission/reception part 283. A user can input an instruction to the controller 280 using an input/output device 281 such as a keyboard and a touch panel.

The memory device 280c or the external memory device 282 may be embodied by a non-transitory computer readable recording medium. Hereafter, the memory device 280c and the external memory device 282 are collectively referred to as the recording medium. In the present specification, the term "recording medium" may refer to only the memory device 280c, only the external memory device 282 or both of the memory device 280c and the external memory device 282.

Substrate Processing

The substrate processing (that is, manufacturing processes of a semiconductor device) will be described with reference to FIG. 8. FIG. 8 is a flow chart schematically illustrating the substrate processing according to the embodiments described herein. A process of forming the sacrificial film 104 (that is, a sacrificial film forming process) and a process of modifying the sacrificial film 104 (that is, a sacrificial film modifying process) according to the substrate processing will be described.

Sacrificial Film Forming Process S110

In the sacrificial film forming process S110, the sacrificial film 104 is formed using a general plasma CVD apparatus. For example, a common parallel plate plasma type substrate processing apparatus (plasma CVD apparatus) is used to form the sacrificial film 104. Therefore, the description of the plasma CVD apparatus of forming the sacrificial film 104 will be omitted.

First, the substrate 100 in the processing state shown in FIG. 1A is transferred (loaded) into the plasma CVD apparatus. Therefore, the control electrode 101, the pedestal 102 and the counter electrode 103 are formed on the substrate 100.

After the substrate 100 is loaded and the substrate 100 is heated to a predetermined temperature, the silicon-containing gas and the oxygen-containing gas are supplied to the process chamber. The silicon-containing gas contains impurities such as carbon (C) components and boron (B) components. For example, tetraethyl orthosilicate ($Si(OC_2H_5)_4$, also referred to as "TEOS") gas may be used as the silicon-containing gas. For example, the oxygen ($O_2$) gas may be used as the oxygen-containing gas.

Figure 5:
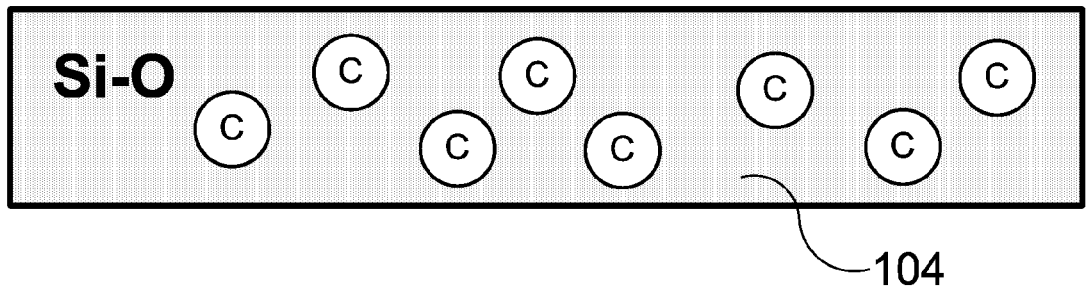
FIG. 5 schematically illustrates a processing state of a sacrificial film according to the embodiments described herein.

The TEOS gas and the $O_2$ gas supplied to the process chamber react with each other to form the sacrificial film 104 on a portion of the substrate 100, the control electrode 101, the pedestal 102 and the counter electrode 103. As shown in FIG. 5, the sacrificial film 104 formed in the sacrificial film forming process S110 is a carbon-containing $SiO_2$ film containing silicon components and the carbon components originally contained in the TEOS gas and oxygen (O) components originally contained in the $O_2$ gas. Instead of the TEOS gas, a gas containing the silicon components and the boron components may be used as the silicon-containing gas. When the gas containing the silicon components and the boron components is used, in FIG. 5, a boron-containing $SiO_2$ film containing the boron components is formed in place of the carbon components.

After a predetermined time elapses and a carbon-containing $SiO_2$ film with a desired thickness is formed, the supply of each of the process gases is stopped.

Sacrificial Film Modifying Process S120

Subsequently, the process S120 of modifying the sacrificial film 104 (that is, the sacrificial film modifying process) S120 will be described. In the sacrificial film modifying process S120, the substrate processing apparatus 200 shown in FIG. 3 is used. Hereinafter, the sacrificial film modifying process S120 will be described in detail. In the following description, the operations of the components of the substrate processing apparatus 200 are controlled by the controller 280.

Substrate Loading and Placing Step S130

The substrate support table 212 of the substrate processing apparatus 200 is lowered to the position for transferring the substrate 100 (that is, the substrate transfer position described above), and the lift pins 207 penetrate the through-holes 214 of the substrate support table 212. As a result, the lift pins 207 protrude from the surface of the substrate support table 212 with a predetermined height. In parallel with the operations described above, an inner atmosphere of the transfer space 206 is exhausted to adjust the inner pressure of the transfer space 206 to a pressure equal to or less than a pressure of the adjacent vacuum transfer chamber (not shown). In the substrate loading and placing step S130, the substrate 100 on which the sacrificial film 104 containing the impurities such as the carbon components described above is formed is to be loaded.

Subsequently, the gate valve 149 is opened to spatially connect the vacuum transfer chamber (not shown) to the transfer space 206. Then, the substrate 100 is loaded (transferred) into the transfer space 206 from the vacuum transfer chamber by a vacuum transfer device (not shown).

Substrate Moving Step (Moving Substrate to Substrate Processing Position) S140

Figure 3:
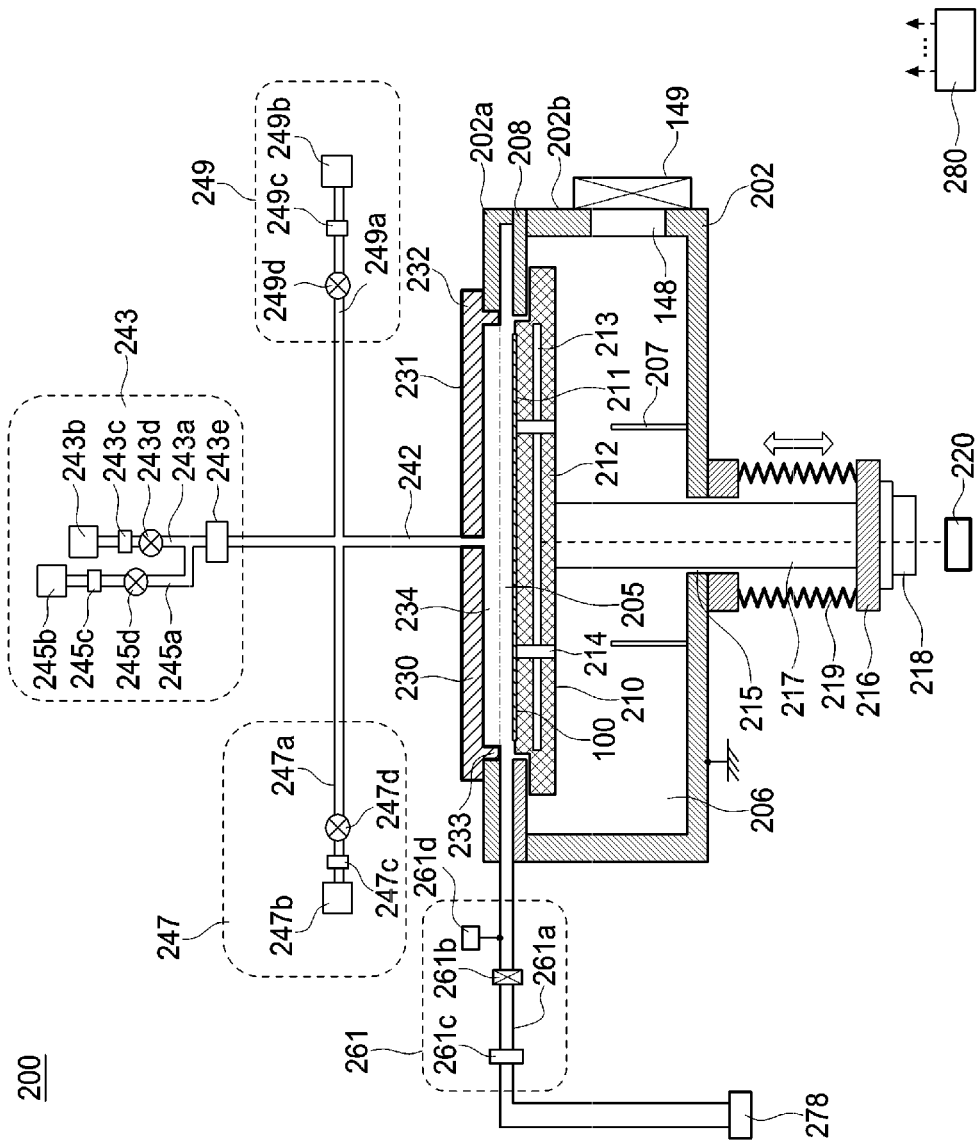
FIG. 3 schematically illustrates a vertical cross-section of a substrate processing apparatus according to the embodiments described herein.

After a predetermined time elapses, the substrate support table 212 is elevated to transfer the substrate 100 onto the substrate placing surface 211, and then further elevated until the substrate 100 is at the substrate processing position as shown in FIG. 3.

Heating Step S150

After the substrate support table 212 is elevated to the substrate processing position, by exhausting the inner atmosphere of the process space 205 via the exhaust pipe 262, the inner pressure of the process space 205 is adjusted to a predetermined pressure. While adjusting the inner pressure of the process space 205 to the predetermined pressure, the substrate 100 is heated such that a temperature of the substrate 100 is adjusted to a predetermined temperature. For example, the predetermined temperature may range from 500° C. to 600° C.

By heating the substrate 100 in a state where the sacrificial film 104 formed on the substrate 100 contains the impurities, the degree of binding of silicon and silicon (Si—Si) or the degree of binding of silicon and oxygen (Si—O) in the sacrificial film 104 is increased. By increasing the degree of binding, the framework of the $SiO_2$ film is established. When heating the substrate 100, the inert gas is supplied through the third gas supply system 249. Instead of supplying the inert gas, the $O_2$ gas may be supplied through the first gas supply system 243.

Modifying Step S160

After the substrate 100 is heated for a predetermined time, the $O_2$ gas in the plasma state is supplied through the first gas supply system 243 while maintaining the heating of the substrate 100. The $O_2$ gas is activated into the plasma state by the RPU 243*e*.

Figure 6:
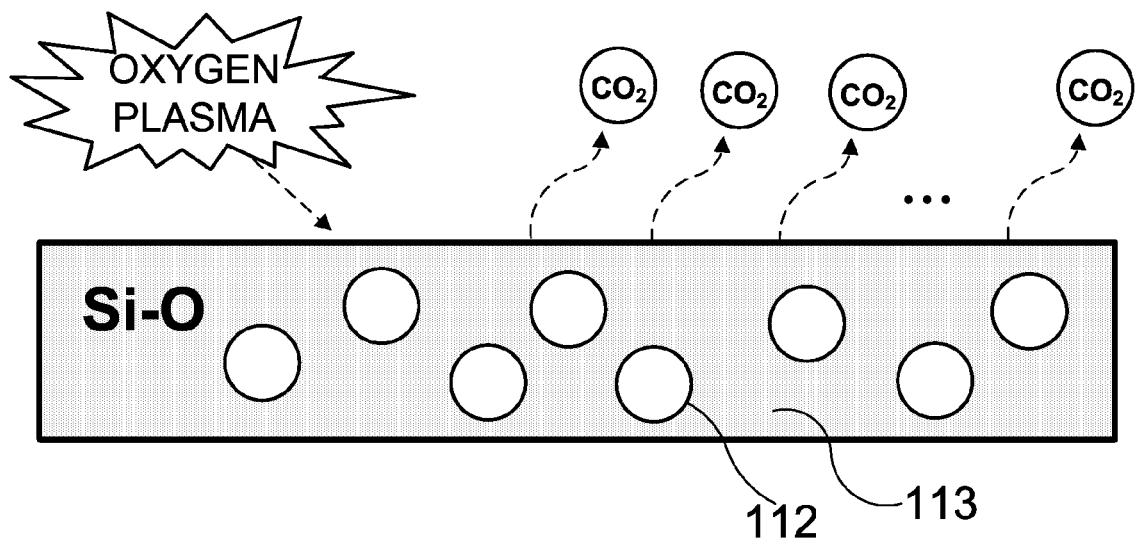
FIG. 6 schematically illustrates a processing state of the sacrificial film when the sacrificial film is modified according to the embodiments described herein.

As shown in FIG. 6, the oxygen-containing gas containing the oxygen components is activated into the plasma state (that is, oxygen ($O_2$) plasma), and then the oxygen plasma is supplied to the sacrificial film 104. The oxygen components in the oxygen plasma react with the carbon components in the sacrificial film 104 to desorb (eliminate) the carbon components from the sacrificial film 104. In the modifying step S160, voids 112 are formed by portions of the sacrificial film 104 where the carbon components are desorbed. Thereby, the sacrificial film 104 is modified into a film including the voids 112, that is, a modified sacrificial film 113. The oxygen-containing gas may also be referred to as a "modifying gas" because it has the property of modifying the sacrificial film 104.

Since the modified sacrificial film 113 contains the voids 112, it is possible to obtain a high wet etching rate. Therefore, the modified sacrificial film 113 can be provided with the etching selectivity with respect to the movable electrode 111 to be formed later.

In addition, the desorbed carbon components react with the oxygen components in the oxygen plasma to form $CO_2$ gas, and the $CO_2$ gas is exhausted from the process space 205.

Next, a comparative example in which the modifying step S160 is performed without performing the heating step S150 will be described. In the modifying step S160, the substrate 100 is heated and processed by the plasma with the oxygen-containing gas (that is, the substrate 100 processed by the oxygen plasma). By processing the substrate 100 in the modifying step S160 according to the above comparative example, the carbon components in the $SiO_2$ film (that is, the sacrificial film 104) are desorbed (eliminated). After the carbon components are desorbed, voids are formed in the $SiO_2$ film similar to the embodiments as shown in FIG. 6.

Since the substrate 100 is heated in parallel with the formation of the voids according to the comparative example, the $SiO_2$ film is also heated after the voids are formed. However, when the substrate 100 is heated, the degree of binding of the respective components is increased. As a result, the $SiO_2$ film (that is, the sacrificial film 104) shrinks. In addition, according to the comparative example, the voids are formed in the sacrificial film 104. Therefore, when the substrate 100 is continued to be heated in parallel with the formation of the voids according to the comparative example, the sacrificial film 104 shrinks to be deformed significantly. As a result, the wet etching rate of the modified sacrificial film 113 is decreased.

In addition, when the sacrificial film 104 is deformed, the polysilicon film 108 is formed thereon in accordance with a shape of the deformed sacrificial film 104. Therefore, a lower surface of the polysilicon film 108 may be uneven. That is, the lower surface of the polysilicon film 108 may include concave and convex portions. When the electric power is supplied to the movable electrode 111 in this state, the electric power may be concentrated on the concave and convex portions or the electric power may not propagate easily.

However, according to the embodiments, since the framework of the $SiO_2$ film (that is, the sacrificial film 104) is established by increasing the degree of binding in the heating step S150, the $SiO_2$ film (that is, the modified sacrificial film 113) does not shrink even when the substrate 100 is continued to be heated when the voids 112 are formed in the modifying step S160. Therefore, the modified sacrificial film 113 is not deformed. As a result, it is possible to obtain a high wet etching rate. In addition, it is possible to form the polysilicon film 108 without concave and convex portions on the sacrificial film 104.

Hydrophobization Processing Step S170

A hydrophobization processing step S170 may be further performed. In the hydrophobization processing step S170, after the oxygen ($O_2$) plasma is supplied for a predetermined time, the valve 243*d* is closed to stop the supply of the oxygen plasma, and the valve 245*d* is opened to supply hydrogen ($H_2$) plasma. The hydrogen-containing gas such as the $H_2$ gas supplied through the hydrogen-containing gas supply system 245 is activated into the plasma state by the RPU 243*e*.

The hydrogen plasma supplied onto the substrate 100 reacts with the silicon components and the oxygen components on a surface of the modified sacrificial film 113, and the surface of the modified sacrificial film 113 is hydrogen-terminated. By hydrogen-terminating the surface of the modified sacrificial film 113, the surface of the modified sacrificial film 113 is rendered hydrophobic.

By providing the hydrophobicity as described above, it is possible to suppress the moisture in the air from permeating into the voids 112 inside the modified sacrificial film 113. In the present specification, for example, the air refers to an atmosphere that the substrate 100 comes into contact when the substrate 100 moves to a next substrate processing apparatus other than the substrate processing apparatus 100.

A state of the modified sacrificial film 113 when the moisture is permeated into the modified sacrificial film 113 will be described. As described in FIGS. 1A through 2D, various steps are performed until the sacrificial film 104 is etched by the wet etching process. Among the steps, for example, in a step of forming the polysilicon film 108, the substrate 100 is heated. In the step of forming the polysilicon film 108, the moisture in the sacrificial film 104 thermally expands, and the sacrificial film 104 may be deformed or broken by the expansion of the moisture.

When the sacrificial film 104 is deformed or broken, the lower surface of the polysilicon film 108 may be uneven. That is, the lower surface of the polysilicon film 108 may include concave and convex portions. When the electric power is supplied to the movable electrode 111, the electric power may be concentrated on the concave and convex portions or the electric power may not propagate easily.

However, when the surface of the modified sacrificial film 113 is hydrogen-terminated according to the embodiments, it is possible to suppress the moisture in the air from permeating into the voids 112 inside the modified sacrificial film 113. Therefore, it is possible to suppress the deformation or the breakage of the sacrificial film 104. That is, when the electric power is supplied to the movable electrode 111, it is possible to suppress the phenomena that the electric power is concentrated on the concave and convex portions or does not propagate easily.

Figure 7:
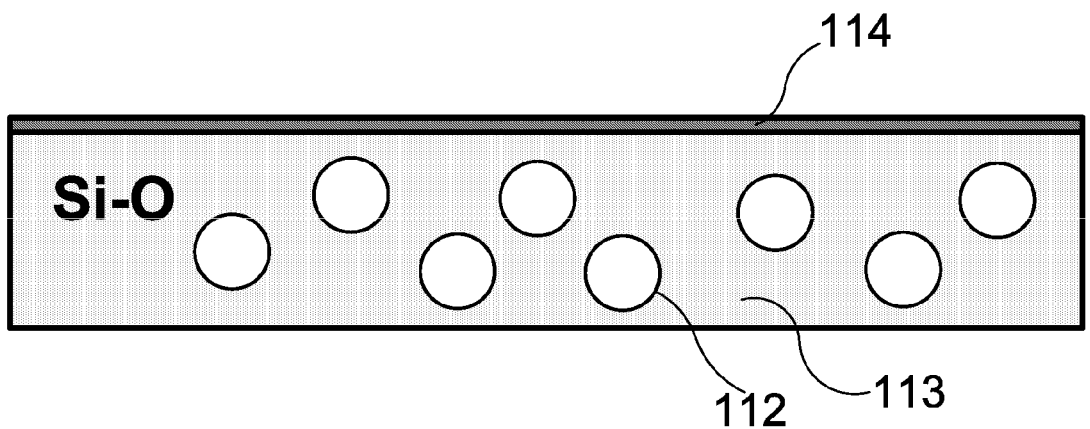
FIG. 7 schematically illustrates a processing state of the sacrificial film when a cover film is formed on the sacrificial film according to the embodiments described herein.

In the hydrophobization processing step S170, instead of supplying the hydrogen-containing gas (that is, the hydrogen plasma), it is more preferable that a $SiO_2$ film 114 serving as a cover film is formed on the sacrificial film 113 as shown in FIG. 7 by supplying the silicon-containing gas through the second gas supply system 247 and the oxygen-containing gas through the first gas supply system 243.

As generally known, when the modified sacrificial film 113 is hydrogen-terminated, the adhesion of polysilicon or the like onto the modified sacrificial film 113 is weak. Therefore, it is difficult to form the polysilicon film 108 on the modified sacrificial film 113. However, when the $SiO_2$ film 114 serving as the cover film is formed on the modified sacrificial film 113, since the silicon components or the oxygen components in the $SiO_2$ film and the polysilicon are easily bonded, as shown in FIG. 1F, it is possible to easily form the polysilicon film 108 serving as a silicon-containing film on the cover film.

After a predetermined time elapses and the surface of the modified sacrificial film 113 is hydrogen-terminated (or the cover film with a desired thickness is formed), the supply of each of the process gases is stopped.

Substrate Unloading Step S180

After the sacrificial film with a desired film thickness is formed, the substrate support table 212 is lowered such that the substrate 100 is moved to the substrate transfer position. After moving the substrate 100 to the substrate transfer position, the substrate 100 is unloaded from the transport space 206.

Other Embodiments

While the technique is described in detail by way of the above-described embodiments, the above-described technique is not limited thereto. The above-described technique may be modified in various ways without departing from the gist thereof.

For example, the above-described embodiments are described by way of an example in which the oxygen gas serving as the first element-containing gas (first process gas) is used to modify the sacrificial film. However, the above-described technique is not limited thereto. For example, a gas with the property of reacting with the impurities in the sacrificial film and desorbing the impurities may be used instead of the oxygen gas. For example, the water vapor ($H_2O$) gas may be used to modify the sacrificial film.

According to some embodiments in the present disclosure, it is possible to form the sacrificial film with a high wet etching rate so as to obtain the wet etching selectivity with respect to the movable electrode when manufacturing the cantilever structure sensor.

What is claimed is:

1. A method of manufacturing a semiconductor device comprising:
   (a) placing a substrate with a sacrificial film comprising a silicon dioxide film and containing impurities on a substrate support in a process chamber, wherein the sacrificial film is formed so as to cover a control electrode, a pedestal and a counter electrode formed on the substrate;
   (b) heating the substrate and establishing a framework of the sacrificial film by increasing a degree of binding of silicon and silicon (Si—Si) or a degree of binding of silicon and oxygen (Si—O) while the impurities are contained therein; and
   (c) modifying the sacrificial film into a modified sacrificial film by supplying an oxygen-containing gas in a plasma state to the substrate to desorb the impurities from the sacrificial film after (b) in a state where the framework of the sacrificial film is established.

2. The method of claim 1, wherein the oxygen-containing gas is supplied to the substrate in (b).

3. The method of claim 2, further comprising:
   (d) terminating the modified sacrificial film by supplying a hydrogen-containing gas to the substrate after (c).

4. The method of claim 3, wherein the hydrogen-containing gas is in a plasma state.

5. The method of claim 4, wherein (c) and (d) are continuously performed in the process chamber.

6. The method of claim 3, wherein (c) and (d) are continuously performed in the process chamber.

7. The method of claim 2, further comprising:
   (e) forming a cover film on the modified sacrificial film by supplying the oxygen-containing gas and a silicon-containing gas to the substrate after (c).

8. The method of claim 7, wherein (c) and (e) are continuously performed in the process chamber.

9. The method of claim 8, wherein a silicon-containing film is formed on the cover film after the cover film is formed in (e).

10. The method of claim 7, wherein a silicon-containing film is formed on the cover film after the cover film is formed in (e).

11. The method of claim 1, wherein an inert gas is supplied to the substrate in (b).

12. The method of claim 11, further comprising:
   (d) terminating the modified sacrificial film by supplying a hydrogen-containing gas to the substrate after (c).

13. The method of claim 11, further comprising:
(e) forming a cover film on the modified sacrificial film by supplying the oxygen-containing gas and a silicon-containing gas to the substrate after (c).

14. The method of claim 1, further comprising:
(d) terminating the modified sacrificial film by supplying a hydrogen-containing gas to the substrate after (c).

15. The method of claim 14, wherein the hydrogen-containing gas in a plasma state is supplied in (d).

16. The method of claim 14, wherein (c) and (d) are continuously performed in the process chamber.

17. The method of claim 1, further comprising:
(e) forming a cover film on the modified sacrificial film by supplying the oxygen-containing gas and a silicon-containing gas to the substrate after (c).

18. The method of claim 17, wherein the substrate is placed on the substrate support in (e).

19. The method of claim 17, wherein a silicon-containing film is formed on the cover film after the cover film is formed in (e).

20. The method of claim 1, further comprising:
(d) forming a photoresist and a hole on the modified sacrificial film after (c);
(e) performing a dry etching process to remove the photoresist after the hole is formed in (d); and
(f) forming a polysilicon film on the hole and the modified sacrificial film after the photoresist is removed in (e).

\* \* \* \* \*